US011626654B2

(12) United States Patent
Wang et al.

(10) Patent No.: US 11,626,654 B2
(45) Date of Patent: Apr. 11, 2023

(54) HEAT DISSIPATING ANTENNA STRUCTURES

(71) Applicant: University of South Carolina, Columbia, SC (US)

(72) Inventors: Guoan Wang, Irmo, SC (US); Jinqun Ge, West Columbia, SC (US); Sanjib Sur, Cayce, SC (US); Srihari Nelakuditi, Columbia, SC (US)

(73) Assignee: UNIVERSITY OF SOUTH CAROLINA, Columbia, SC (US)

( * ) Notice: Subject to any disclaimer, the term of this patent is extended or adjusted under 35 U.S.C. 154(b) by 46 days.

(21) Appl. No.: 17/320,437

(22) Filed: May 14, 2021

(65) Prior Publication Data

US 2021/0359389 A1  Nov. 18, 2021

Related U.S. Application Data

(60) Provisional application No. 63/025,333, filed on May 15, 2020.

(51) Int. Cl.
*H01Q 1/02* (2006.01)
*H05K 1/02* (2006.01)
*H01Q 9/04* (2006.01)
*H01Q 21/06* (2006.01)

(52) U.S. Cl.
CPC .............. *H01Q 1/02* (2013.01); *H01Q 9/0407* (2013.01); *H01Q 21/065* (2013.01); *H05K 1/0237* (2013.01)

(58) Field of Classification Search
CPC ............ H01Q 1/02; H01Q 1/38; H01Q 1/243; H01Q 9/0407; H01Q 21/065; H05K 2201/066
See application file for complete search history.

(56) References Cited

U.S. PATENT DOCUMENTS

| 10,320,051 | B2 * | 6/2019 | Chiu ................... H05K 7/20336 |
| 2013/0207274 | A1 * | 8/2013 | Liu .......................... H01L 23/66 257/774 |
| 2021/0183797 | A1 * | 6/2021 | Vincent ................. H01P 11/002 |

OTHER PUBLICATIONS

R. Georgerian and M. I. Montrose, "Product Safety and the Heat Sink—Dilemma of Minimizing Radiated Emissions and Maximizing Thermal Cooling," 2003 International Symposium on Electromagnetic Compatibility, vol. 1, pp. 134-137, Aug. 2003.

S.K. Das and T. Roy, "An investigation on radiated emissions from heatsinks," IEEE International Symposium on Electromagnetic Compatibility, vol. 2, pp. 784-789, Aug. 24-28, 1998.

(Continued)

*Primary Examiner* — Hasan Islam
(74) *Attorney, Agent, or Firm* — Burr & Forman LLP

(57) ABSTRACT

An antenna assembly includes an antenna and a heatsink. The antenna may be configured to support radio communications and generate heat, and may include a forward antenna surface configured to transmit or receive communications signals and a rear antenna surface that is affixed to a substrate. The heatsink structure may be positioned to be within a forward electromagnetic field that is emitted from the forward antenna surface and away from the rear antenna surface. The heatsink structure may be configured to perform a convection operation between the antenna and a fluid to perform thermal dissipation of the heat from the antenna.

17 Claims, 18 Drawing Sheets

(56) References Cited

OTHER PUBLICATIONS

A. Dolente, U. Reggiani, and L. Sandrolini, "Comparison of radiated emissions from different heatsink configurations," IEEE 6th International Symposium on Electromagnetic Compatibility and Electromagnetic Ecology, pp. 49-53, Jun. 21-24, 2005.

N.J. Ryan, B. Chambers, and D.A. Stone, "FDTD modeling of heatsink RF characteristics for EMC mitigation," IEEE Transactions on Electromagnetic Compatibility, vol. 44, Issue 3, pp. 458-465, Aug. 2002.

L. Covert and J. Lin, "Simulation and measurement of a heatsink antenna: a dual-function structure," IEEE Trans. Antennas Propag., vol. 54, No. 4, pp. 1342-1345, Apr. 2006.

J. J. Casanova, J. A. Taylor, and J. Lin, "Design of a 3-D fractal heatsink antenna," IEEE Antennas Wireless Propag. Lett., vol. 9, pp. 1061-1064, 2010.

Y. Aslan, J. Puskely, J. H. Janssen, M. Geurts, A. Roderper, and A. Yarovoy, "Thermal-Aware Synthesis of 5G Base Station Antenna Arrays: an Overview and a Sparsity-Based Approach," IEEE Access, vol. 6, pp. 58868-58882, Oct. 2018.

\* cited by examiner

HEAT DISSIPATING ANTENNA STRUCTURES

CROSS-REFERENCE TO RELATED APPLICATIONS

This application claims the benefit of U.S. Provisional Application No. 63/025,333 filed on May 15, 2020, the entire contents of which are hereby incorporated herein by reference.

TECHNICAL FIELD

Example embodiments generally relate to antenna technologies and, more particularly, relate to heat dissipation in the context of antenna technologies.

BACKGROUND

Mobile communications technologies are continuing to evolve to support higher communication speeds and associated throughput. In addition to these demands, there is a continual demand for communications devices to be smaller in size. As such, more functionalities, and more importantly the components to support such functionalities, are being packed onto smaller circuit boards within smaller housings. Such components include multiple communications antennas and associated circuit chips.

When these components operate, particularly antennas, the components generate heat. In some instances, the amount of heat that is generated can be affect the operation of the communications device or even permanently damage the device. As such, more functionality and smaller size brings a greater need to manage heat within a communications device. For this and other reasons, there continues to be a need for improved heat dissipating technologies for use in the context of communications devices.

BRIEF SUMMARY OF SOME EXAMPLES

According to some example embodiments, an antenna assembly is provided. The antenna assembly may comprise an antenna and a heatsink structure. The antenna may be configured to support radio communications and generate heat. The antenna may comprise a forward antenna surface configured to transmit or receive communications signals and a rear antenna surface that is affixed to a substrate. The heatsink structure may be positioned to be within a forward electromagnetic field that is emitted from the forward antenna surface and away from the rear antenna surface. The heatsink structure may be configured to perform a convection operation between the antenna and a fluid to perform thermal dissipation of the heat from the antenna.

According to some example embodiments, a mobile terminal is provided. The mobile terminal may comprise an antenna assembly. The antenna assembly may comprise an antenna and a heatsink structure. The antenna may be configured to support radio communications and generate heat. The antenna may comprise a forward antenna surface configured to transmit or receive communications signals and a rear antenna surface that is affixed to a substrate. The heatsink structure may be positioned to be within a forward electromagnetic field that is emitted from the forward antenna surface and away from the rear antenna surface. The heatsink structure may be configured to perform a convection operation between the antenna and a fluid to perform thermal dissipation of the heat from the antenna.

According to some example embodiments, a base station is provided. The base station may comprise an antenna assembly. The antenna assembly may comprise an antenna and a heatsink structure. The antenna may be configured to support radio communications and generate heat. The antenna may comprise a forward antenna surface configured to transmit or receive communications signals and a rear antenna surface that is affixed to a substrate. The heatsink structure may be positioned to be within a forward electromagnetic field that is emitted from the forward antenna surface and away from the rear antenna surface. The heatsink structure may be configured to perform a convection operation between the antenna and a fluid to perform thermal dissipation of the heat from the antenna.

BRIEF DESCRIPTION OF THE SEVERAL VIEWS OF THE DRAWING(S)

Having thus described some example embodiments in general terms, reference will now be made to the accompanying drawings, which are not necessarily drawn to scale, and wherein:

DETAILED DESCRIPTION

Figure 1A:
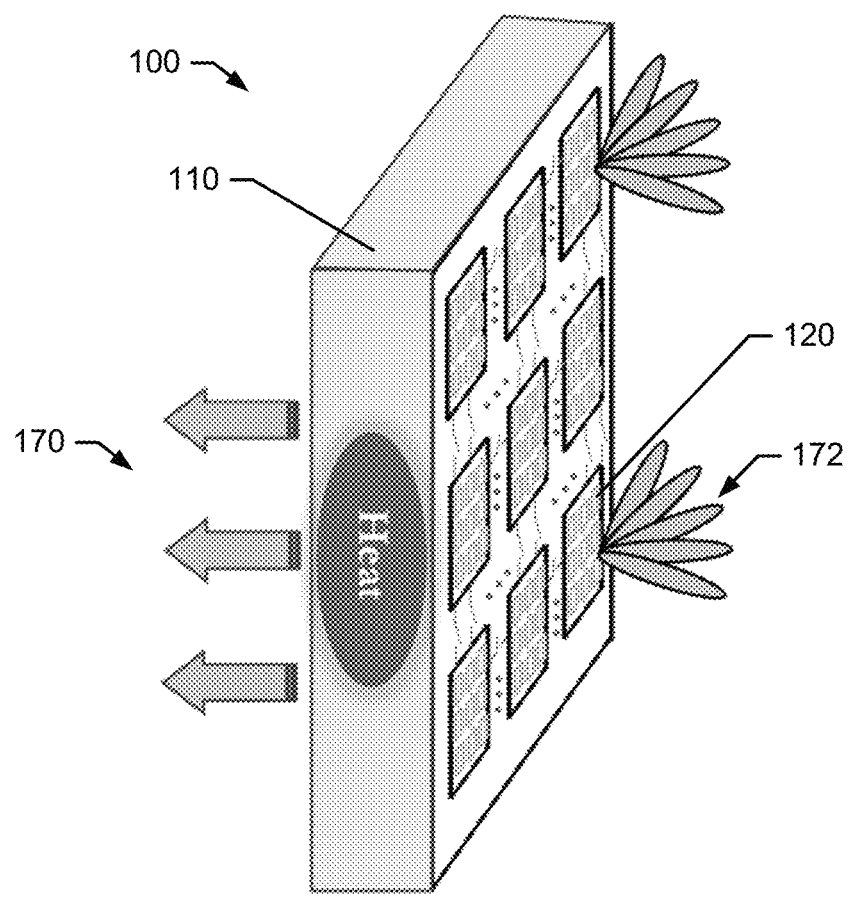
FIG. 1A illustrates an example antenna assembly with an array of patch antennas.

Some example embodiments now will be described more fully hereinafter with reference to the accompanying drawings, in which some, but not all example embodiments are shown. Indeed, the examples described and pictured herein should not be construed as being limiting as to the scope, applicability, or configuration of the present disclosure. Rather, these example embodiments are provided so that this disclosure will satisfy applicable legal requirements. Like reference numerals refer to like elements throughout.

As used herein the term "or" is used as the logical or where any one or more of the operands being true results in the statement being true. As used herein, the phrase "based on" as used in, for example, "A is based on B" indicates that B is a factor that determines A, but B is not necessarily the only factor that determines A.

According to some example embodiments, an antenna assembly comprising an antenna and heatsink structures in the form of, for example, a heatsink fin is provided. The antenna, according to various example embodiments may be any type of antenna. As mentioned above, antennas may generate an antenna field (receive or transmit field) that has a particular pattern, and, during communications, the antenna may transmit or receive wireless energy signals. In the process of receiving or transmitting the signals, some energy may be lost to heating of the antennas and related components, which causes the temperature of the antenna (and surrounding components) to increase, potentially to levels that hinder operation of the communications device or even damage the communications device.

While example embodiments described herein may be applicable to a variety of types of antennas, many example embodiments herein are described in the context of a patch antenna. Regardless, an antenna may have a forward electromagnetic (EM) field that is emitted from a forward antenna surface, and a rear antenna surface, for example, affixed to a substrate that may comprised of a dielectric. On an opposite side of the substrate from the antenna (i.e., on a rear or back side of the substrate), the antenna assembly may comprise a ground plane.

Following from above, according to some example embodiments, heat management may be undertaken through the use of one or more heatsink structures of a heatsink device, for example, in the form of one or more heatsink fins. While some conventional antenna assemblies employ a heatsink device on a rear side of an antenna assembly, e.g., affixed to or adjacent to the ground plane, according to some example embodiments, a heatsink structure may be positioned to be within a forward electromagnetic field that is emitted from the forward antenna surface and away from the rear antenna surface. In this regard, the heatsink structure may be configured to perform a convection operation between the antenna and a fluid (e.g., air) to perform thermal dissipation of the heat from the antenna.

With the significant growth in mobile traffic and number of wireless communication standards, fifth generation (5G) mobile networks are being rapidly developed and are forecasted to have a larger capacity than current 4G mobile networks, along with capabilities such as multifunction, ultra-high speed and ultra-low latency. In addition, modern wireless communications and radar systems, especially in case of MIMO systems, are being demanded with miniaturized size, and are required to operate at multiple-frequency bands to provide the enhanced and multifunctional performances. However, miniaturization can pose crucial issues, related to the device's topology, such as the parasitic couplings between circuit elements and localized heat dissipation. Generally, thermal management can play an essential role in design of microwave and radio-frequency components and systems. It is recognized that temperature has a strong influence on reliability and may result in undesirable coupling effects. Localized temperature increase, caused by power dissipation, can, in some instances, drastically affect performance of the communications devices. For example, in wireless units for 5G small cell systems that use massive-element antennas, a large amount of heat is generated due to the increased power consumption associated with the greater number of analog devices. As chip densities increase and advance, due to the power dissipated by all these individual components (mostly by the inefficient power amplifiers), these chips act as volume heat sources. The excess heat originating from these chips and the antennas should be transferred and removed from the antenna system in order to maintain a safe, long-lasting and reliable operation at, for example, the base station or mobile device. However, as a result of having a separate transceiver chip for each antenna element, high packaging densities of front-end circuitry at millimeter waves make the integration of a heat management/cooling system a challenging task. Moreover, the strict cost and heat removal requirements of the high volume 5G base station market favor the use of low-cost, passive cooling strategies via the use of, for example, heat sinks, heat spreaders, heat pipes or thermal interface materials (TIM) in lieu of fans or forced liquids that require the use of electricity. For this reason, heatsink structures with a larger volume and surface area may be required to dissipate the heat for microwave antennas, which increases the size of wireless units and poses restrictions on where the antennas can be installed.

Referring now to FIG. 1A, an example antenna assembly 100 is shown. The antenna assembly 100 may include a plurality of patch antennas 120 that are affixed to a dielectric substrate 110, which may be a circuit board. In this regard, for spatial reference, the plurality of patch antennas may be affixed to a forward side of the substrate 110 and a ground plane (not shown) may be disposed within the substrate 110 (rearward of the forward side) or a rear side of the substrate 110 (i.e., opposite the patch antennas. The plurality of antennas may be configured into a switchable array, where the array is controllable by a communications controller (not shown). Due to the positioning of the ground plane, a forward EM field 172 may be emitted from a forward antenna surface of each activated antenna 120. As mentioned above, when the antennas 120 are actively involved in signal reception or transmission, energy may be lost into the antenna assembly 100 as heat. In conventional systems where heat management components are only disposed on a rear side of the substrate 110, heat may be drawn in a rearward direction as indicated by the arrows 170.

Figure 1B:
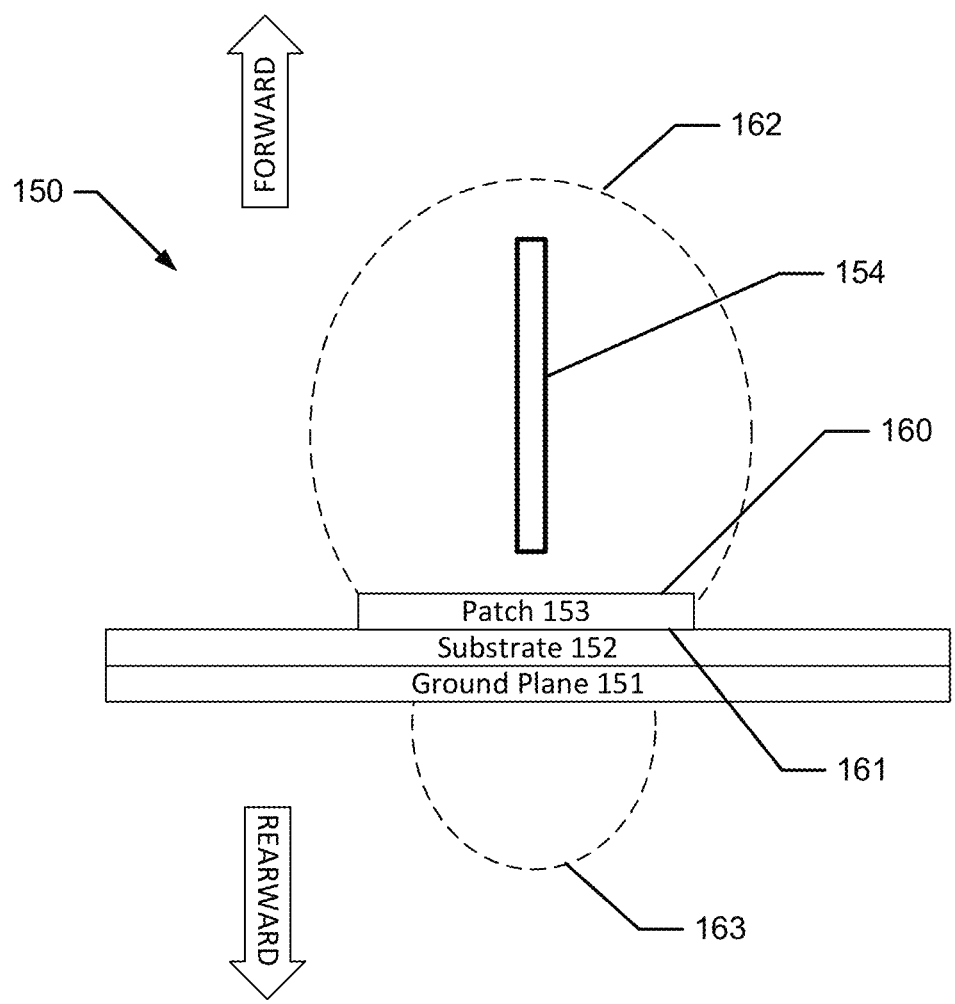
FIG. 1B illustrates a cross-section view of an example antenna assembly including a heatsink structure according to some example embodiments.

Providing further detail of the structure of a patch antenna assembly 150, a description of FIG. 1B is now provided, according to some example embodiments. In this regard, the patch antenna assembly 150 may comprise a ground plane 151, a substrate 152, and a patch 153. The substrate 152 may be disposed between the ground plane 151 and the patch 153. The ground plane 151 and patch 153 may be formed of a conductive material, such as a metal (e.g., copper, aluminum, etc.). In the orientation of the patch antenna assembly 150 as shown in FIG. 1B, the forward direction is upward and the rearward direction is downward. As such, the patch 153 may comprise a forward antenna surface 160 and a rear antenna surface 161. According to some example embodiments, the forward antenna surface 160 may be exposed to, for example, air. According to some example embodiments, the forward antenna surface 160 is not shielded by a ground plane in the forward direction. As such, a forward EM field 162 may have a higher gain than a rearward EM field 163, which is affected by the ground plane 161.

Additionally, according to some example embodiments, the antenna assembly 150 may include a heatsink structure 154 on a forwards side of the patch 153 and within the forward EM field 162. The heatsink structure 154 may be formed as an elongated member in the form of, for example, a fin. The heatsink structure may take on a number of shapes which may include a plate-shape (e.g., a rectangular-shaped plate), a post-shape (e.g., box-shaped or cylindrical), or the like. The heatsink structure 154 may be formed, for example, of a high heat conductive material such as metal (e.g., aluminum, copper, or the like). The heatsink structure 154 may be suspended above patch 153 as shown in FIG. 1B to form a standoff gap or the heatsink structure 154 may be directly in contact with the patch 153. The standoff gap may be defined between a rearward edge of the heatsink structure and the forward antenna surface.

Figure 1C:
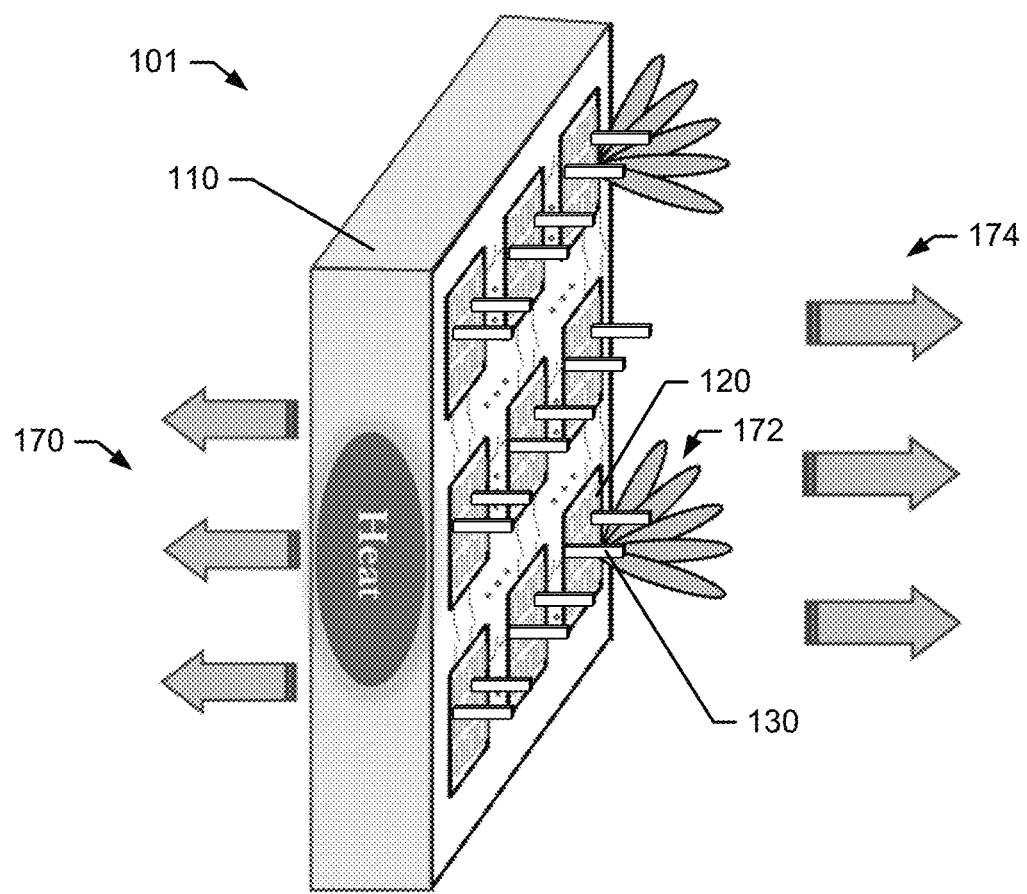
FIG. 1C illustrates an example antenna assembly with an array of patch antennas having heatsink structures according to some example embodiments.

With the context of FIG. 1B provided, a description of another example embodiment of an antenna assembly 101 is provided in FIG. 1C. In this regard, the antenna assembly 101 is similar to the antenna assembly 100, however, the antenna assembly 101 of FIG. 1C includes forward side heat management in the form of heatsink structures 130. As further described herein, the heatsink structures 130 may be placed forward of, or on the forward side of the patch antennas 120. By placing the heatsink structures 130 on the forward side (e.g., on or adjacent to the forward antenna surface) and within the forward EM field 172, heat from the antenna patches 120 can be dissipated through the heatsink structures 130 in the forward direction as indicated by arrows 174. Such heatsink structures 130 may be implemented alone or in conjunction with a rear heat management element (e.g., a rear side heatsink) to dissipate heat in both the forward direction 174 and in the rearward direction 170.

As further described herein, the heatsink structures, for example in the form of heatsink structures 130, may operate to increase the surface area of a high heat region to increase heat dissipation within a communications device, such as, for example a mobile terminal, base station, or the like. As such, the heatsink structures may take of the form of elongated poles or elongated plates that have high surface area relative to their footprint. As further described herein, the heatsink structures may be integrated into the antennas 120 and the antenna characteristic may be considered when designing the antenna structure with heatsink structures. According to some example embodiments, such coordinated design efforts may be needed since the forward position of the heatsink structures 130 (e.g., heatsink fins) may affect the forward EM field 172 and may negatively affect the antenna's gain and ability to receive and transmit signals. Further, the heat dissipation efficiency of using such heatsink structures 130 improves performance by dissipating heat from the surfaces of both the antenna 120 and the heatsink structure 130, which makes it possible to reduce the size of heatsink structures 130 and miniaturize wireless communications units. The layout and dimensions of the proposed integrated heat sinks may be variable for optimized electromagnetic performance of antenna and thermal dissipation efficiency.

In consideration of these example embodiments and the further embodiments described herein, antenna assemblies, as well as associated methods, are provided for use in communications devices such as mobile terminals and base stations, that perform antenna heat dissipation. Such example embodiments may be employed in the context of antennas configured for operation at any frequency (e.g., microwave frequencies) or any wavelength (e.g., millimeter wavelengths or mm-waves). In this regard, example embodiments may be compatible and co-designed with any arbitrary antenna to realize a natural cooling technique. Further, example heatsink structures, such as fins, may have minimized EM distortion and maximum thermal dissipation, for example, particularly for the scale of microwave antennas. As such, according to some example embodiments, a heat management solution in the form of heatsink structures is provided that may be either directly connected to and/or integrated with, the forward surface antenna or may reside above the forward antenna surface to dissipate radiant heat.

According to some example embodiments, the heatsink structures may be connected to the forward surface of the antenna via, for example, a MEMS (micro-electromechanical systems) based cantilever-type switch for controllable and optimized EM (electromagnetic) and thermal dissipation performance. In this regard, according to some example embodiments, the heatsink structures may be co-designed with an antenna from early conceptual stages of electronics product design to ensure desired operation and functionality of the antenna. Example embodiments may leverage the concept of dissipating heat from the antenna's forward surface with, for example, an integrated heatsink device and associated structures as described herein. Such solutions, according to some example embodiments, may be compatible with the current thermal dissipation technologies. According to some example embodiments, such a heatsink structure may be used in association with microwave antennas for wireless communications and, in some instances, wireless communications in the context of medical applications. More particularly, some example embodiments may relate to devices and methods for reducing or maintaining temperatures of microwave antennas used in such applications. Applications for various example embodiments may be numerous and may relate to wireless communications, in some instances, in the medical instrument market.

Methods and structures for heat dissipation for antennas (e.g., microwave antennas) are provided, according to some example embodiments, which are compatible and co-designed with an arbitrary antenna with the use of a natural cooling method. The structures, according to some example embodiments, of the integrated heatsink structures can achieve minimized EM distortion and maximum thermal dissipation. As such, according to some example embodiments, a heatsink structure is provided according to some example embodiments either directly or indirectly connected to an antenna or connected through, for example, a MEMS-based cantilever type switch for controllable and optimized EM and thermal dissipation performance.

According to some example embodiments, a heatsink structure (e.g., a heatsink fin) may be a metallic member used to transfer heat from electronic components like an antenna or other components to the surroundings, in order to prevent the device from overheating. Heat may be transferred by conduction from, for example, the antenna to the heatsink structure. The heat may then be transferred by convection from the heatsink structure to the surrounding fluid (e.g., air). As mentioned above, such heatsink structures can increase the contact surface area between the device (e.g., antenna) and the surrounding air, thereby increasing the opportunity to dissipate heat. Heatsink structures, according to some example embodiments, may have or be embodied as fins separated by a distance which increase/maximize the surface area of a heatsink structure so that more heat can be dissipated. According to some example embodiments, technologies to improve thermal dissipation of antennas can be related to reducing electromagnetic emissions for electromagnetic compatibility or designing antennas that incorporate heatsink structures. Additionally, according to some example embodiments, active electronically scanned antenna arrays with, for example, fan-less central processing unit (CPU) coolers and array layout optimization may be utilized to address the thermal management in 5G base station antenna arrays at mm-waves.

In some example embodiments in the context of wireless communications units, the heat generated by circuits and other components may be dissipated by a heat management device, such as a heat sink, on the rear surface of the antenna assembly, but limited to little or no heat dissipation by the antenna surface itself. Thus, according to some example embodiments, the heat dissipation effect of the antenna may be improved by expanding the surface area (e.g., the metallic surface area) of the antenna elements with a heatsink structure that may be integrated into the antenna from a performance perspective, and thereby increases the share of the total area that is composed of metal. Copper or aluminum may be example metals for the construction of heatsink structures, according to some example embodiments. Both copper and aluminum have very high thermal conductivity. Copper has a slightly higher thermal conductivity than aluminum, but aluminum is lower in cost and has lower density, i.e., less weight.

According to fundamental electromagnetic theory, the performance of an antenna (e.g., frequency, radiation pattern, gain) may be affected by the surrounding environment and dimensions of the antenna. According to some example embodiments, methods and structures are provided that address the effect of the proposed heatsink structures on the antenna parameters such as radiation efficiency, bandwidth, directivity/gain, input impedance, etc.

Figure 2A:
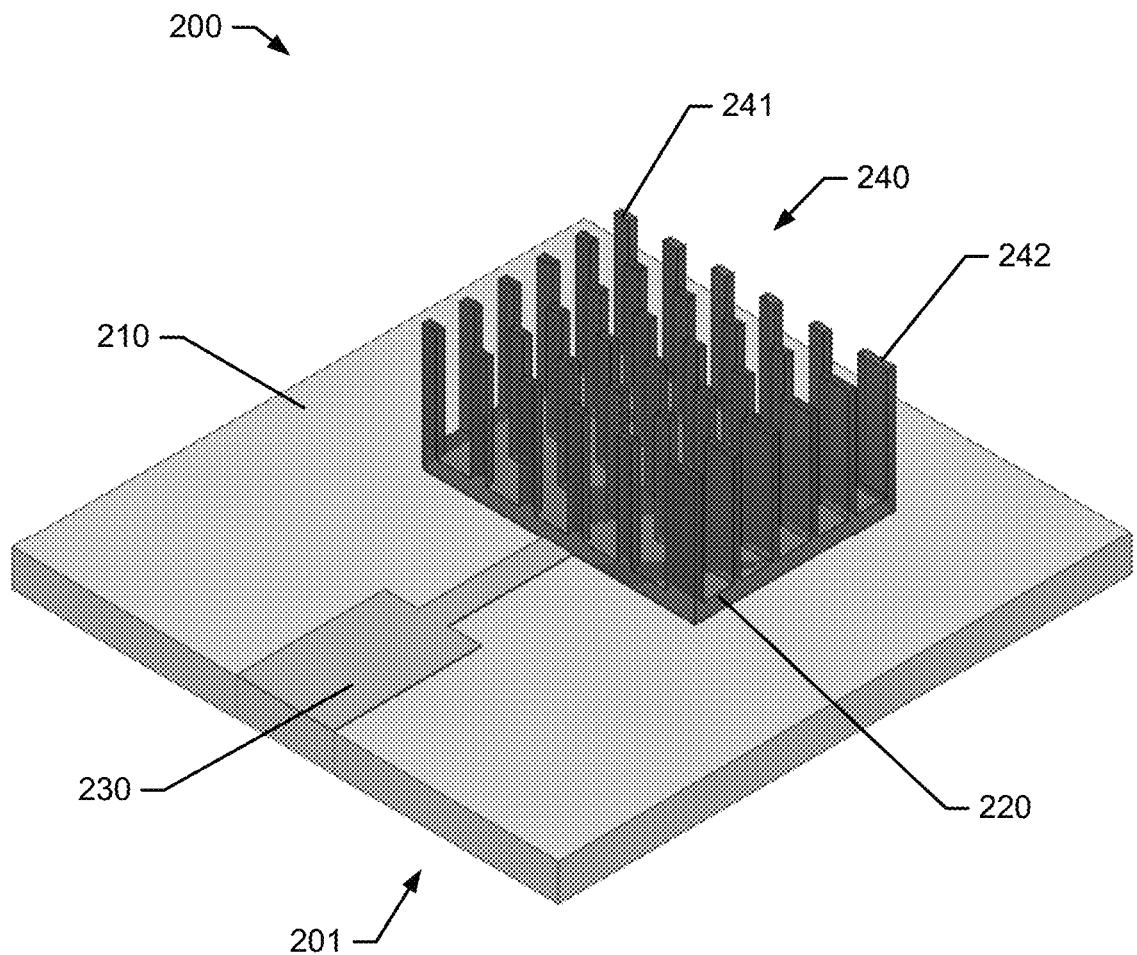
FIG. 2A illustrates an example antenna assembly with heatsink device comprising heatsink structures according to some example embodiments.

Building on the description of example embodiments provided above, the following describes some additional example embodiments and some performance aspects of the same. In this regard, an example embodiment of an antenna assembly 200 is shown in FIG. 2A. The antenna assembly 200 may include an antenna 220 (e.g., patch) with a feed 230 disposed on a forward side of a substrate 210 (e.g., dielectric substrate) with a ground plane 201 disposed on a rear side of the substrate 210. According to some example embodiments, a heatsink device 240 may also be included that is comprised of one or more heatsink structures (i.e., heatsink structures 241 and 242).

In this regard, the heatsink device 240 may be comprised of a plurality of heatsink structures in the form of rods or posts that are elongate in a direction perpendicular with a plane of the antenna (i.e., with the forward antenna surface). The heatsink structures may be in direct physical contact with and in direct electrical connection with the antenna 220. As such, heat from the antenna 220 may wick up the heatsink structures and be dissipated into the fluid (e.g., air) in the surrounding environment.

During design of the antenna assembly 200, the shape and size of the heatsink structures may be adapted to achieve desired antenna parameters and characteristics. In this regard, for example, due to the implementation and the desired parameters and characteristics, the dimensions of the heatsink structures may be different as shown in FIG. 2A where heatsink structure 242 is wider than heatsink structure 241. However, for example, the heatsink structures may all be of the same or different heights.

Figure 2B:
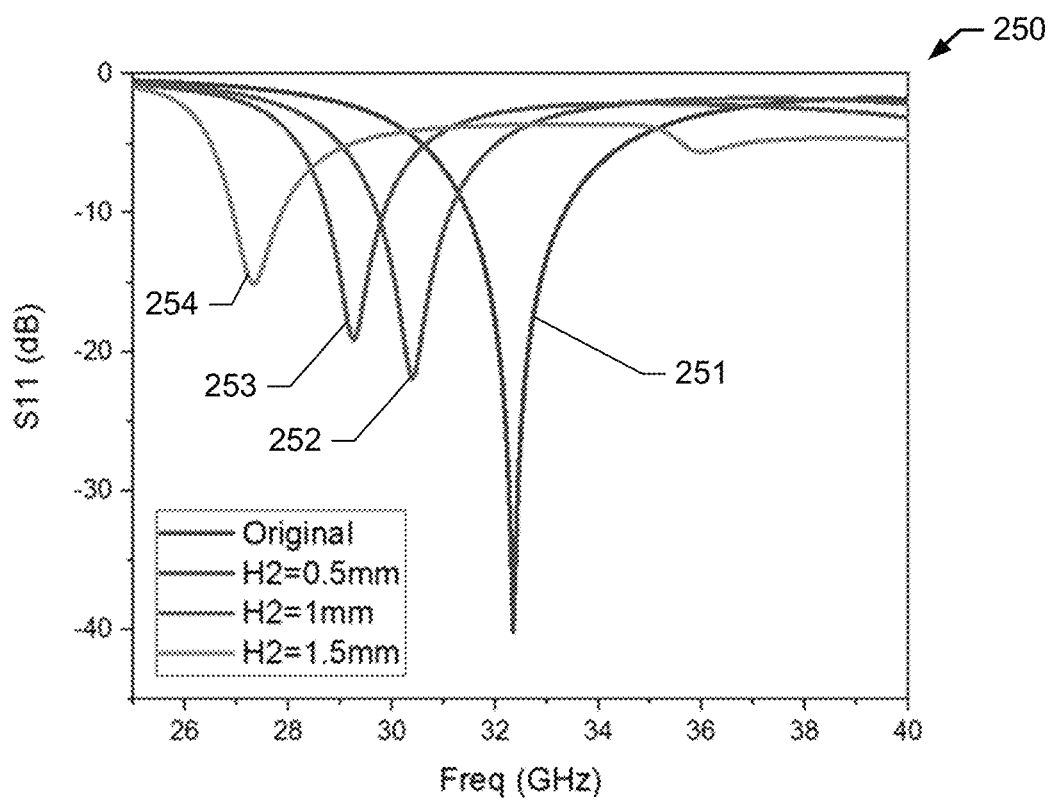
FIG. 2B is a graph of power relative to frequency for the heatsink structure of the antenna assembly of FIG. 2A at different heights according to some example embodiments.

The heatsink device 240 of FIG. 2A may comprise a pin-fin configuration. According to some example embodiments, the heatsink device 240 may be designed with heatsink structures having different heights and orientations. Such parameters can determine a favorable antenna design and an unacceptable antenna design. According to some example embodiments, EM simulations may be performed with, for example, ANSYS HFSS or other simulation software to perform a comprehensive 3 dimensional analysis. In this regard, for example, a patch antenna may be designed at 32 GHz and a pin-fin type heatsink device may then be integrated with the antenna. The simulated results as provided in the graph 250 of FIG. 2B show performance at different structure heights for the heatsink structures of the heatsink device 240. In this regard, the reflection coefficient and associated performance of the antenna 220 with no heatsink structure is provided at 251. The performance of the heatsink structures at a height of 0.5 mm is shown at 252. The performance of the heatsink structures at a height of 1 mm is shown at 253, and the performance of the heatsink structures at a height of 1.5 mm is shown at 254. As can be seen, the frequency response of the antenna shifts with changes in the height of the heatsink structures. The changes in height also change the antenna gain. As such, the results show that the gain of the antenna 220 with the integrated heatsink device 240 can be reduced from about 8.3 dBi to 5.6 dBi due to the EM field propagating through the integrated heatsink structures.

Figure 2C:
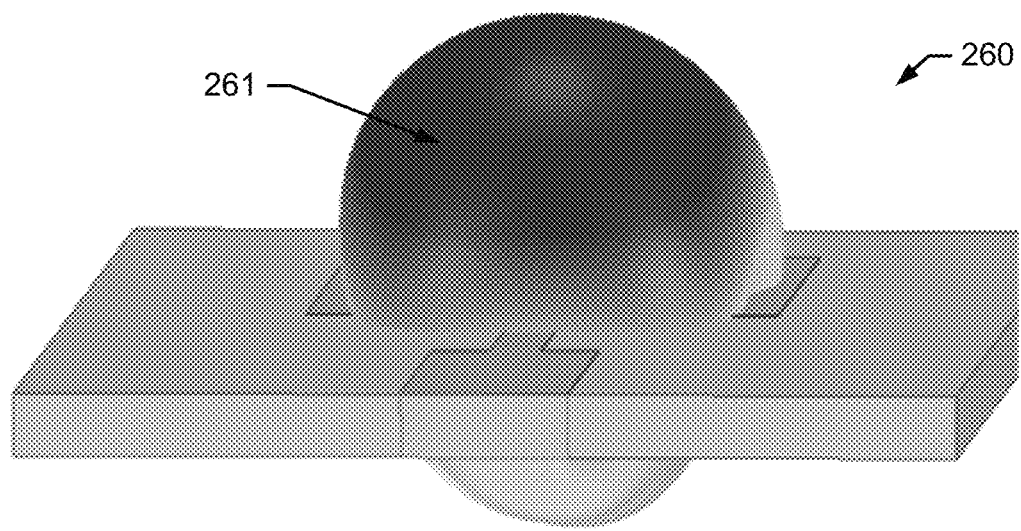
FIG. 2C illustrates a radiation pattern for a patch antenna.
Figure 2D:
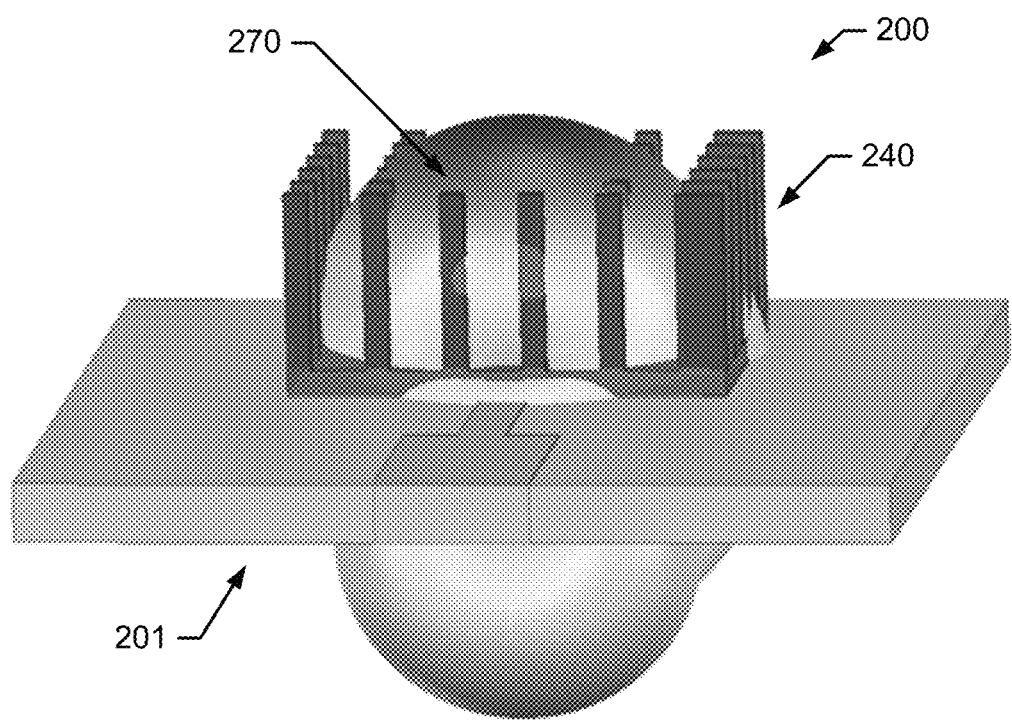
FIG. 2D illustrates a radiation pattern for an antenna having the heatsink structure of the antenna assembly of FIG. 2A according to some example embodiments.

FIGS. 2C and 2D illustrate radiation patterns of the antenna 220. In this regard, for comparison purposes, the antenna assembly 260 shows the radiation pattern 261 of the antenna 220 with no heatsink structures integrated with or otherwise associated with the operation of the antenna 220. Accordingly, the radiation pattern 270 of the antenna assembly 200 is shown in FIG. 2D. As can be seen, the heatsink device 240 also impacts the radiation pattern 270 such that the forward directed lobe is reduced and the rearward directed lobe expands.

Figure 3A:
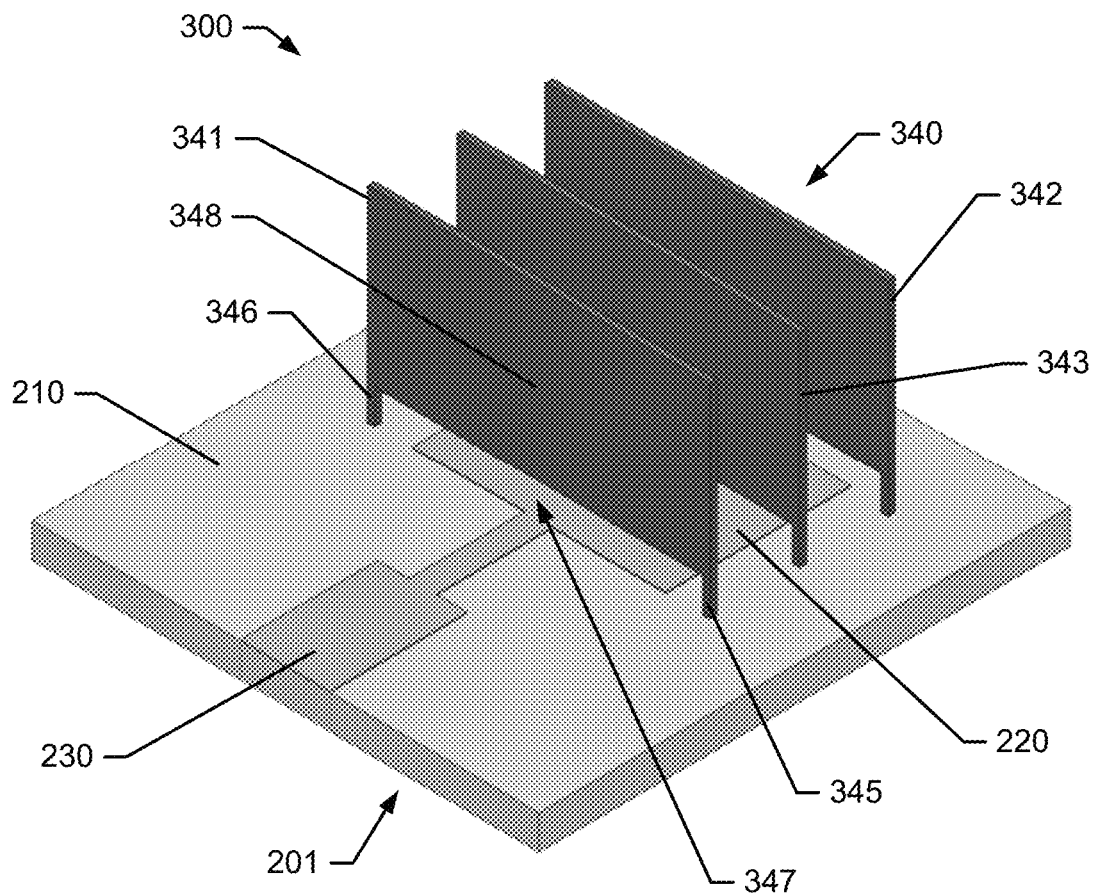
FIG. 3A illustrates an example antenna assembly with heatsink device comprising heatsink structures according to some example embodiments.
Figure 3B:
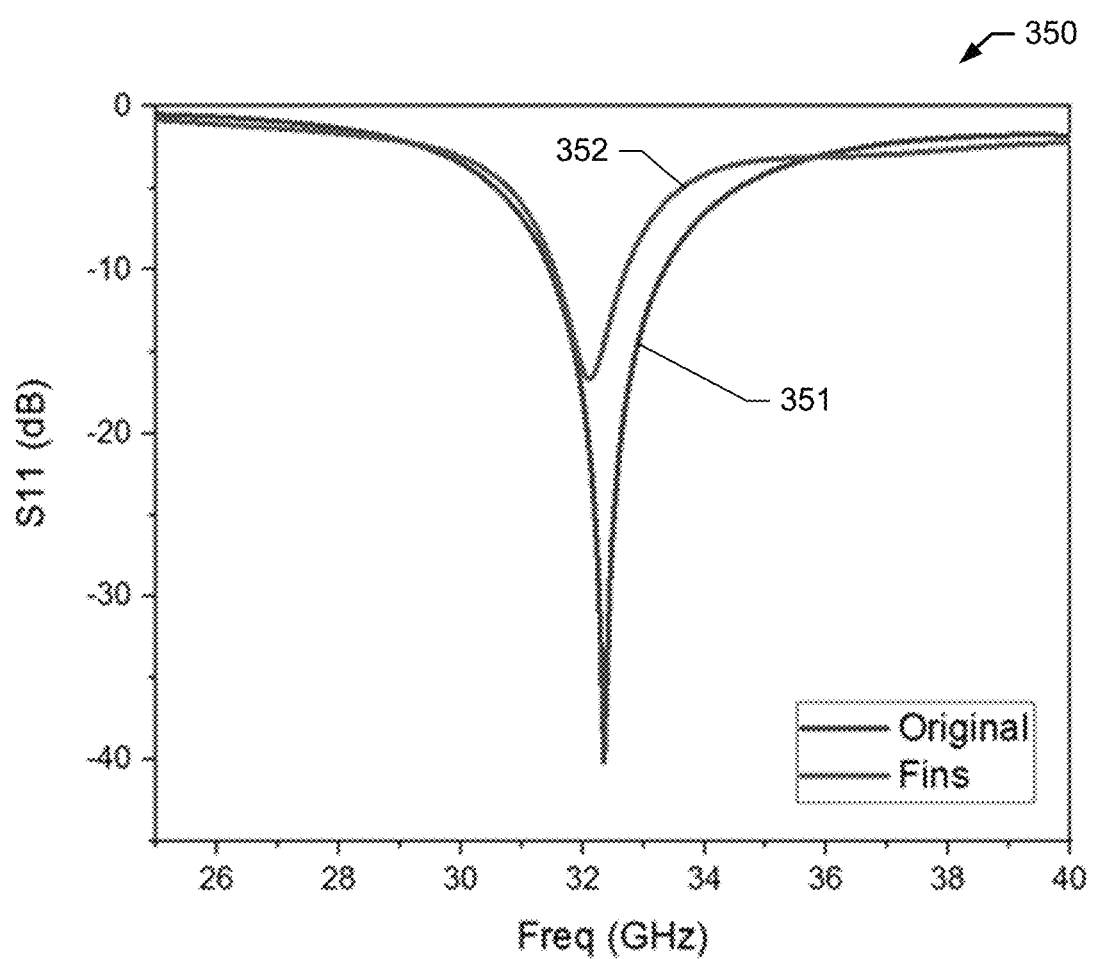
FIG. 3B is a graph of power relative to frequency for the heatsink structure of the antenna assembly of FIG. 3A at different heights according to some example embodiments.
Figure 3C:
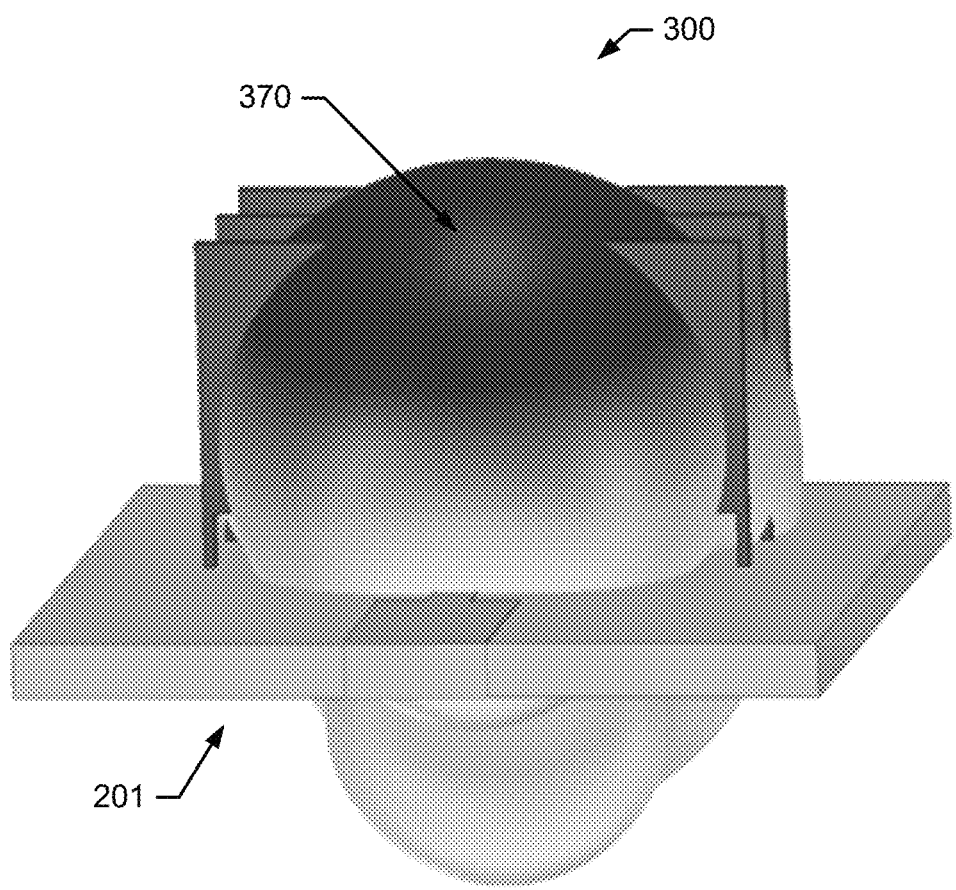
FIG. 3C illustrates a radiation pattern for an antenna having the heatsink structure of the antenna assembly of FIG. 3A according to some example embodiments.

With reference to FIGS. 3A to 3C, another example embodiment of an antenna assembly 300 is shown. While the pin-fin heatsink device 240, as shown in FIG. 2A, has only one orientation due to its symmetry, the example embodiment of the antenna assembly 300 with heatsink device 340 has two orthogonal orientations with respect to the patch antenna's radiating and non-radiating edges. The optional orthogonal orientations can also be considered in antenna design, since this positioning can affect antenna performance. As shown in FIG. 3A, the antenna assembly 300 may include the antenna 220 (e.g., patch) with a feed 230 disposed on a forward side of a substrate 210 (e.g., dielectric substrate) with a ground plane 201 disposed on a rear side of the substrate 210. According to some example embodiments, a heatsink device 340 may also be included that is comprised of one or more heatsink structures (i.e., example heatsink structures 341, 342, and 343).

In this regard, the heatsink structures 341, 342, and 343 of heatsink device 340 may be wide body fin heatsink structures 342, and may be for example extruded. The heatsink structures 341, 342, and 343 may be formed of metal. Additionally, with reference to heatsink structure 341, each heatsink structure 341, 342, and 343 may be raised above the forward antenna surface of the antenna 220. To do so, for example, the heatsink structures 341, 342, and 343, may include posts 345 and 346 (which may also be formed of metal) on the respective structures. The posts 345 and 346 may have a post height that defines a standoff gap for the heatsink structure (e.g., standoff gap 347 for the heatsink structure 341) from the forward antenna surface. Further, the posts 345 and 346 may support a main fin body 348 of the heatsink structure 341 and may be affixed to a the substrate 210 of the antenna assembly 300. As such, the heatsink structures 341, 342, and 343 need not be in physical contact or electrical connection with the antenna 220 or the forward surface of the antenna 220. The main fin body 348 may have dimensions of a height (above the standoff gap), a length, and a width. As described above, the height of the heatsink structures 341, 342, and 343 may again be considered during antenna design. Also, the length of the heatsink structures 341, 342, and 343 may be greater than a length of the antenna 220 so that the posts can be placed outside of the perimeter of the antenna 220. The shape of the heatsink structures 341, 342, and 343, according to some example embodiments, may be a rectangular plate shape that includes planar surfaces that extend in a direction perpendicular to the forward antenna surface. Again, the heatsink structures 341, 342, and 343 may be disposed within the forward EM field of the antenna 220.

As such, the heatsink structures 341, 342, and 343 of the heatsink device 340, according to some example embodiments, may be lifted up from the antenna 220, thereby avoiding direct contact with the antenna 220 and thus minimizing the heatsink device's effect on EM performance of the antenna 220. Despite the lack of direct contact with the antenna 220, the heatsink device 340 may still have better heat dissipation capability due to higher thermal conductivity of metal (e.g., copper) than that of air.

As shown in the graph 350 of FIG. 3B, the effect of the lifted heatsink device 340, according to some example embodiments, is little on the performance of antenna with a maintained gain of 8.2 dBi as indicated by the reflection coefficient performance of the original configuration with no heatsink device shown at 351 and the performance of the with lifted heatsink device 340 shown at 352. As such, the integrated extruded-fin heatsink device 340 can be designed with different height, lifted (standoff) distance, and location from the antenna 220 for optimized performance. For example, when the heat sink is placed away from the forward antenna surface of the antenna 220, the performance of the antenna 220 with the integrated heatsink device 340 can be greatly improved due to the minimized distortion to the propagated EM field of antenna which is strongest around the edge of the antenna 220. Additionally, FIG. 3C illustrates radiation patterns of the antenna assembly 300 including the heatsink device 340. From the illustration of the radiation pattern 370 of the antenna assembly 300, it can be seen that the heatsink device 340 has a lesser impact on the forward directed lobe and the rearward directed lobe, as compared to the heatsink device 240.

Figure 4A:
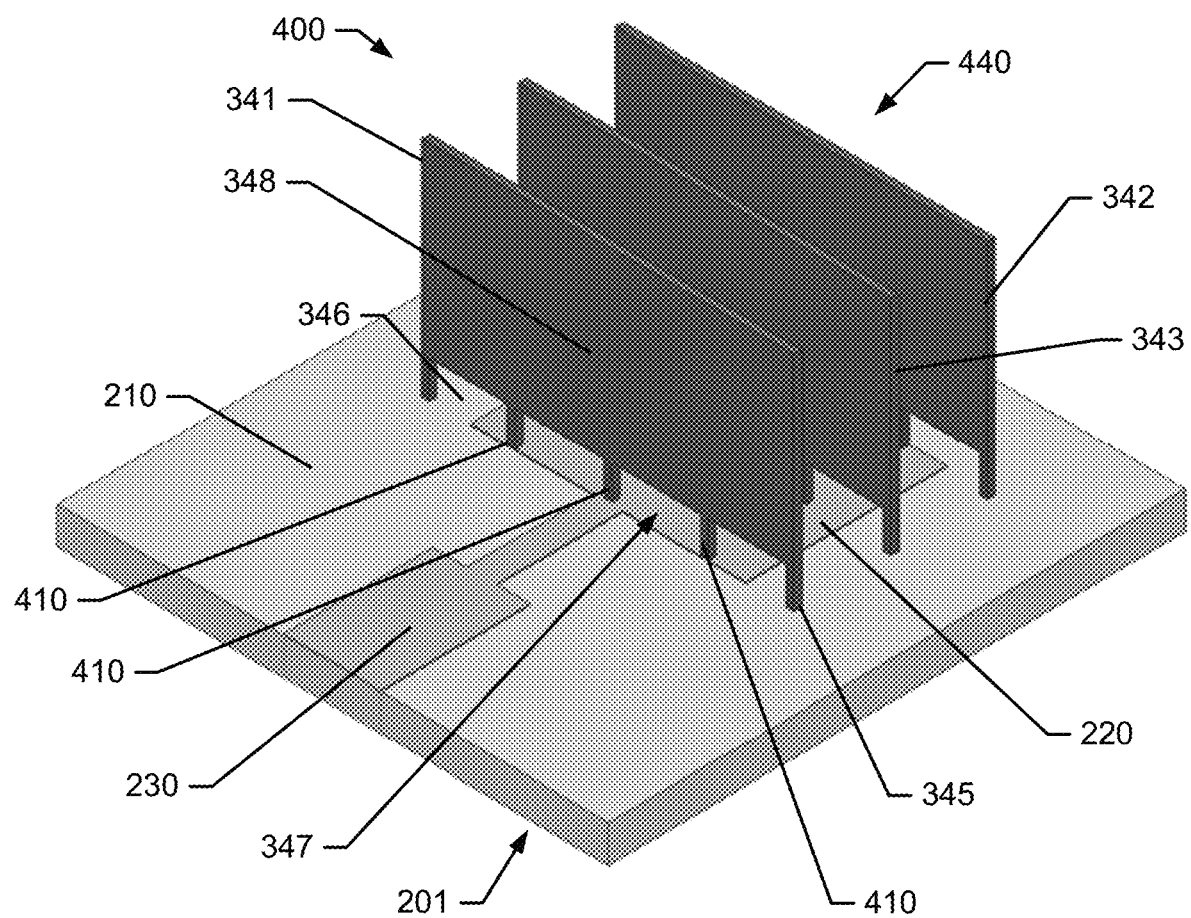
FIG. 4A illustrates an example antenna assembly with heatsink device comprising heatsink structures according to some example embodiments.

With reference to FIGS. 4A to 4D, another example embodiment of an antenna assembly 400 is shown. As shown in FIG. 4A, the antenna assembly 400 may include the antenna 220 (e.g., patch) with a feed 230 disposed on a forward side of a substrate 210 (e.g., dielectric substrate) with a ground plane 201 disposed on a rear side of the substrate 210. According to some example embodiments, a heatsink device 440 may also be included that is comprised of one or more heatsink structures (i.e., example heatsink structures 341, 342, and 343).

As described above, the heatsink structures 341, 342, and 343 of heatsink device 340 may be wide body fin heatsink structures, and may be for example extruded. The heatsink structures 341, 342, and 343 may be formed of metal. Additionally, with reference to heatsink structure 341, each heatsink structures 341, 342, and 343 may be raised above the forward antenna surface of the antenna 220. To do so, for example, the heatsink structures 341, 342, and 343, may include posts 345 and 346 (which may also be formed of metal) on the respective structures. The posts 345 and 346 may have a post height that defines a standoff gap for the heatsink structure (e.g., standoff gap 347 for the heatsink structure 341). Further, the posts 345 and 346 may support a main fin body of the heatsink structure 341 and may be affixed to a the substrate 210 of the antenna assembly 300.

However, in the example embodiment of the antenna assembly 400, the heatsink structures 341, 342, and 343 also include one or more direct contact posts 410. The direct contact posts may also be formed of metal and may directly connect the heatsink structures 341, 342, and 343 to the forward antenna surface of the antenna 220. As such, the heatsink structures 341, 342, and 343 may be in direct physical contact with antenna 220. However, the main fin body 348 may still be lifted off of the antenna 200 by the standoff gap.

Also as described above, the main fin body 348 may have dimensions of a height (above the standoff gap), a length, and a width. Again, the height of the heatsink structures 341, 342, and 343 may be considered during antenna design. Also, the length of the heatsink structures 341, 342, and 343 may be greater than a length of the antenna 220 so that posts can be placed outside of the perimeter of the antenna 220. The shape of the heatsink structures 341, 342, and 343, according to some example embodiments, may be a rectangular plate shape that includes planar surfaces that extend in a direction perpendicular to the forward antenna surface. Again, the heatsink structures 341, 342, and 343 may be disposed within the forward EM field of the antenna 220.

Figure 4B:
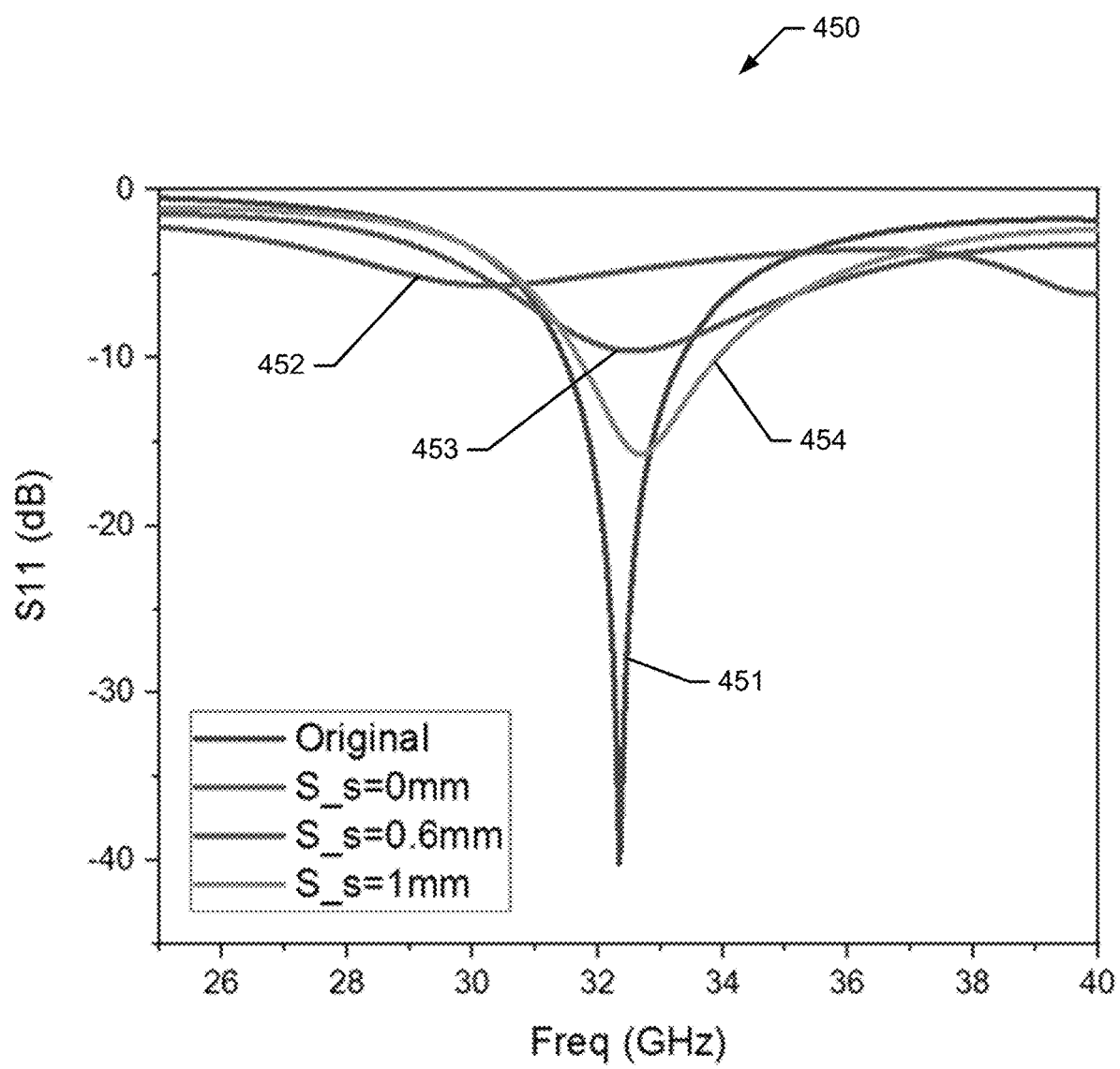
FIG. 4B is a graph of power relative to frequency for the heatsink structure of the antenna assembly of FIG. 4A at different standoff gap heights according to some example embodiments.
Figure 4C:
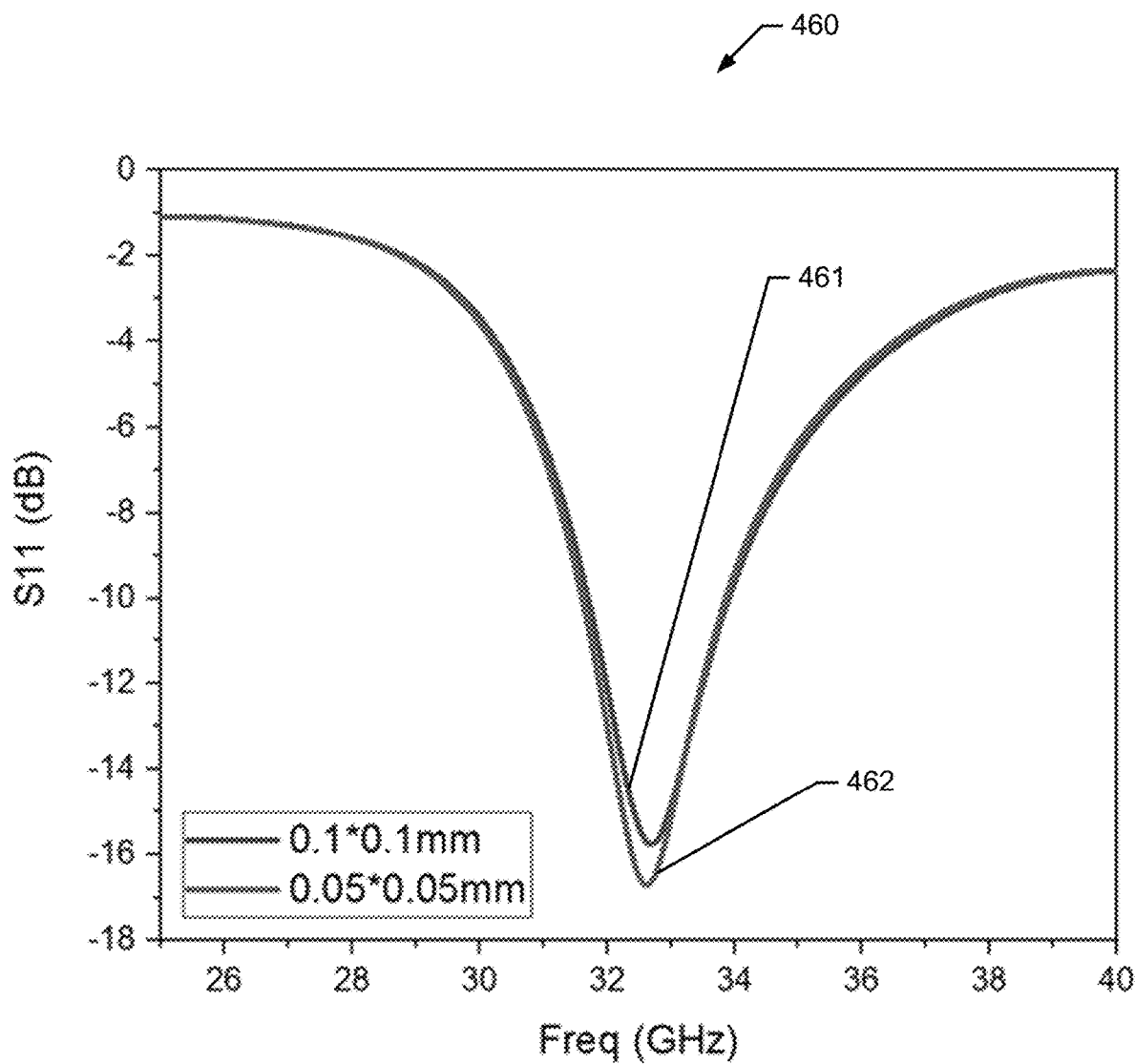
FIG. 4C is a graph of power relative to frequency for the heatsink structure of the antenna assembly of FIG. 4A with different connection sizes for contacting posts according to some example embodiments.
Figure 4D:
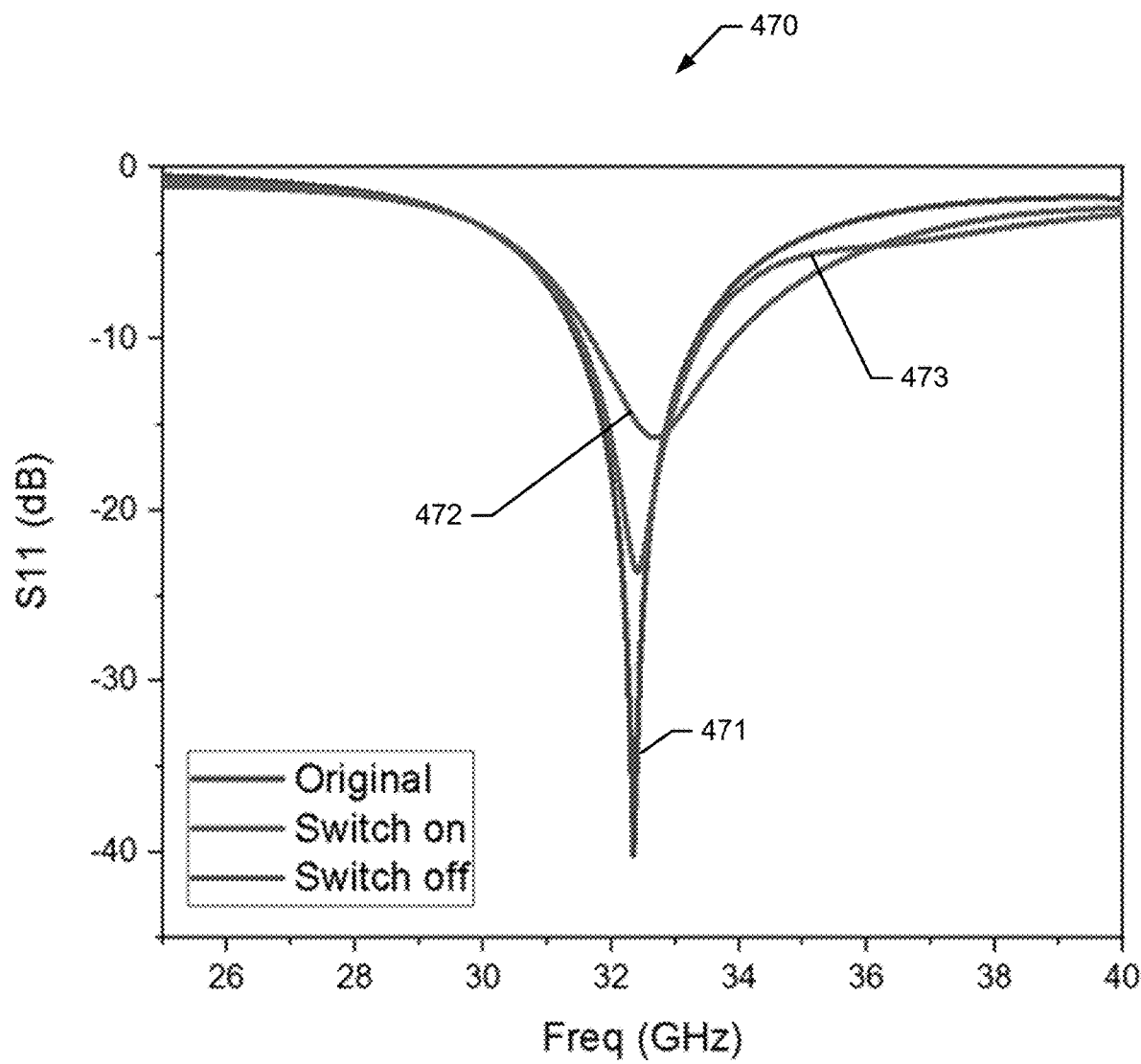
FIG. 4D is a graph of power relative to frequency for the heatsink structure of the antenna assembly of FIG. 4A with and without an impedance matching feed according to some example embodiments.

As such, the heatsink structures 341, 342, and 343 of the heatsink device 340, according to some example embodiments, may be lifted up from the antenna 220, but now also in direct contact with the antenna 220. EM performance of the antenna assembly 400 with the heatsink device 440 having different sizes and location of the metal posts 410 is shown in FIGS. 4B to 4D. EM performance of antenna, according to some example embodiments, may be further improved with the co-design of antenna 220 and the integrated heatsink device 440 by tuning the impedance matching from the feed 230.

As shown in the graph 450 of FIG. 4B, the effect on performance at different distances of the standoff gap is shown. In this regard, the performance with no heatsink device is shown at 451. The performance with no standoff gap (i.e., 0 mm) is shown at 452, with a 0.6 mm standoff gap at 453, and with a 1 mm standoff gap at 454. Further, in the graph 460 of FIG. 4C, the effect of different connection sizes of the posts 410 on the antenna 220 are shown. In this regard, posts having a 0.1 mm by 0.1 mm square connection size is shown at 461, and posts having a 0.5 mm by 0.5 mm square connection size is shown at 462. Also, the graph 470 of the performance of the antenna assembly 400 with an impedance matching feed is shown in FIG. 4D. In this regard, the performance with no heatsink device and no impedance matching is shown at 471. At 472, the performance with the impedance matching switched on and the heatsink device 440 is shown. At 473, the performance with the impedance matching switched off with the heatsink device 440 is shown.

Figure 5:
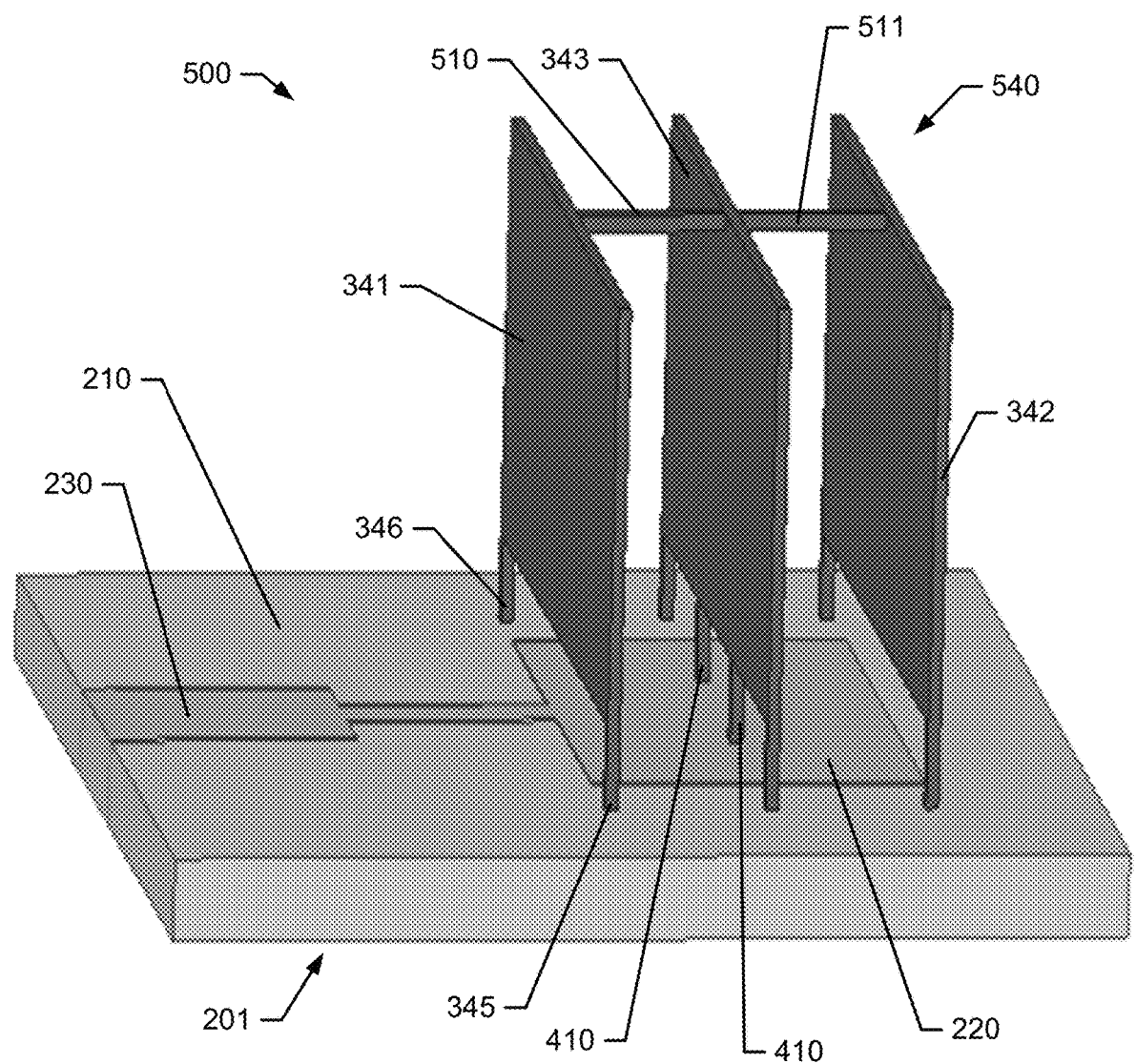
FIG. 5 illustrates an example antenna assembly with heatsink device comprising heatsink structures according to some example embodiments.

FIG. 5 shows another example embodiment of an antenna assembly 500 with a different heatsink device 540. In the example embodiment of the heatsink device 540, the heatsink structure 341 and 342 do not have a direct connection or contact with antenna 220, but the heatsink structure 343 does include posts 410 that contact the forward antenna surface of the antenna 220. Additionally, according to some example embodiments, the heatsink structures 341, 342, and 343 may be directly connected via bridge members 510 and 511. The bridge members 510 and 511 may connect between the heatsink structures 341, 342, and 343 to provide both physical support and electrical connectivity, which may change the radiation pattern of the antenna assembly 500. The bridge members 510 and 511 may therefore be constructed of a conductive material, such as metal.

Figure 6A:
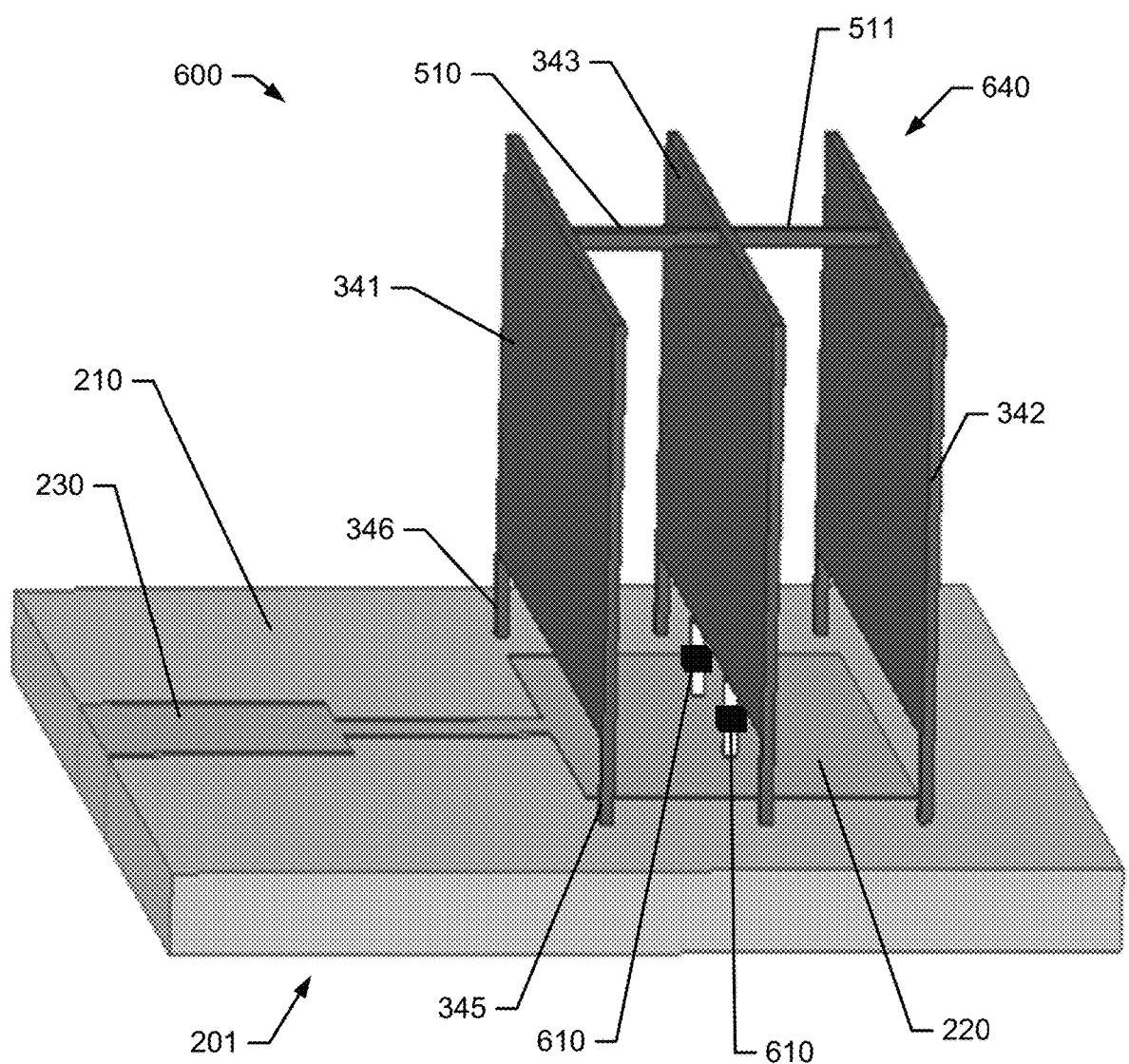
FIG. 6A illustrates an example antenna assembly with heatsink device comprising heatsink structures according to some example embodiments.

Yet another example embodiment is shown in FIG. 6A. The antenna assembly 600 and the heatsink device 640 are the same as shown and described with respect to the antenna assembly 500, with the exception that switch 610 form the direct contact posts or are included in series with the direct contact posts. The switches 610 are controllable via a control signal that may be thermal or electrical. Due to the switching capability, the heatsink device 540 may be tunable through control of the switches 610.

The switch-type connection via the switch 610 between the antenna 220 and the heatsink structure 343, in this example embodiment, may allow for reconfigurable thermal and EM performance. According to some example embodiments, the switches 610 may be micro-electromechanical systems (MEMS) switches, such as MEMS cantilever switches. The switches, for example, may be may be either thermal activated or by electrostatic force with applied DC (direct current) voltage. When the switches 610 are off, the heatsink device 640, according to some example embodiments, has minimum effect on the performance of antenna 220, and when the switches are on, the heatsink device 200 has maximum thermal dissipation performance.

Figure 6B:
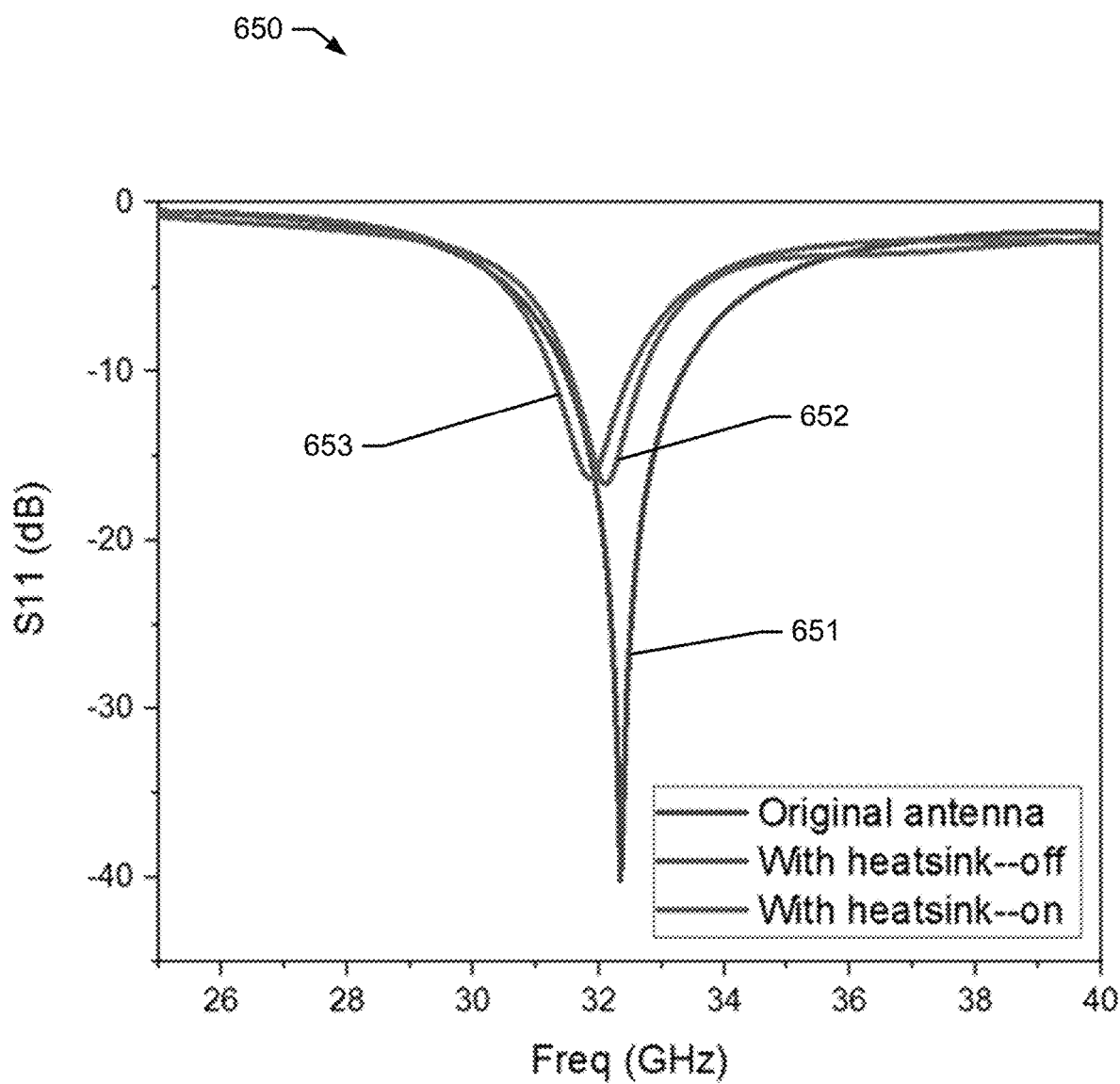
FIG. 6B is a graph of power relative to frequency for the heatsink structure of the antenna assembly of FIG. 6A with controllable switches turned on and off according to some example embodiments.
Figure 6C:
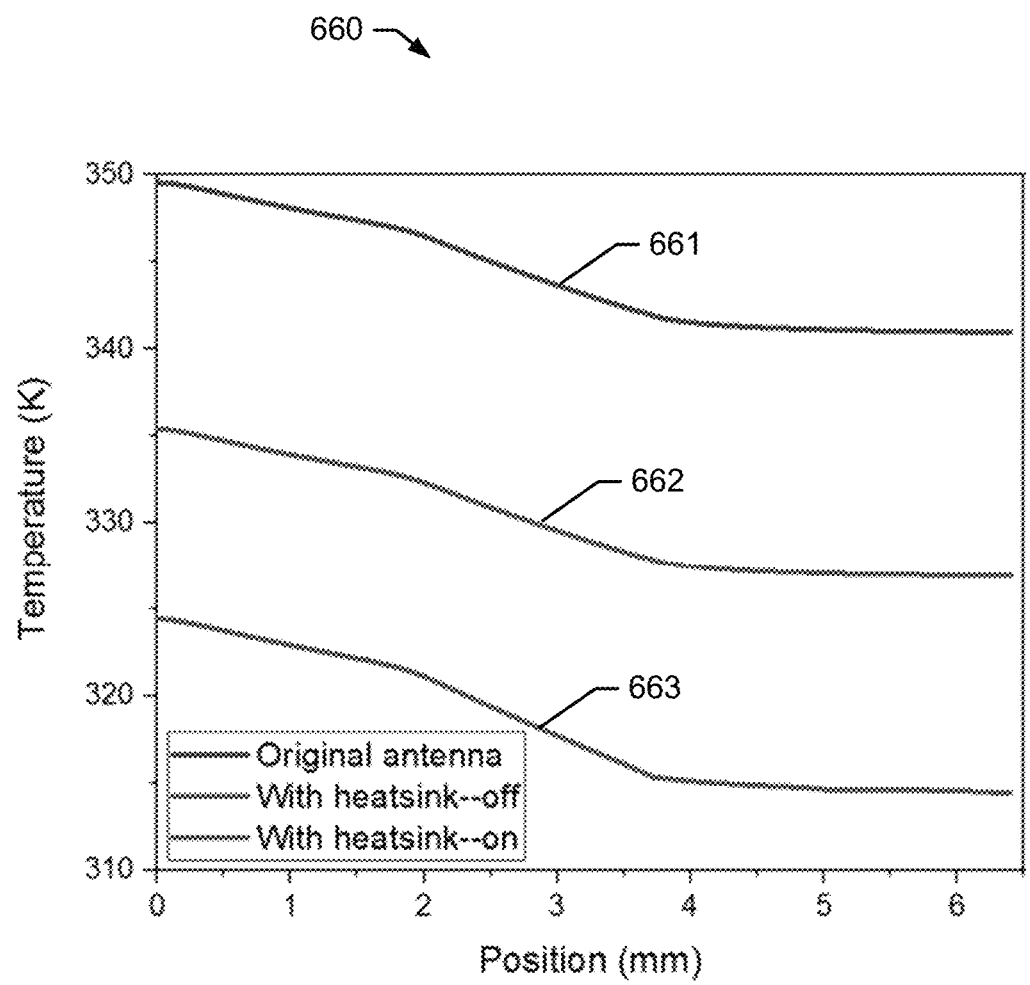
FIG. 6C is a graph of temperature relative to a center position of an antenna having the heatsink structure of the antenna assembly of FIG. 6A with controllable switches turned on and off according to some example embodiments.

As shown in the graph 650 of FIG. 6B, the effect of the switches 610 with the heatsink device 640 is shown. In this regard, the performance with no heatsink device is shown at 651. The performance with the switches off (or open) is shown at 652, and the performance with the switches on (or closed) is shown at 653. Further, with respect to the graph 660 of FIG. 6C, a temperature and position relationship is shown where the graphs indicate the temperature change relative to a center position of the antenna 220. In this regard, for example, a constant 35 milliwatt power was provided as the signal source of the antenna 220, and results show that significant temperature can be decreased with heatsink structures on the forward antenna surface of antenna and fully demonstrate the design efficacy. In this regard, the temperature response of the original antenna with no heatsink device is shown at 661. The temperature response with the switches off is provided at 662 and with the switches on at 663.

Figure 7:
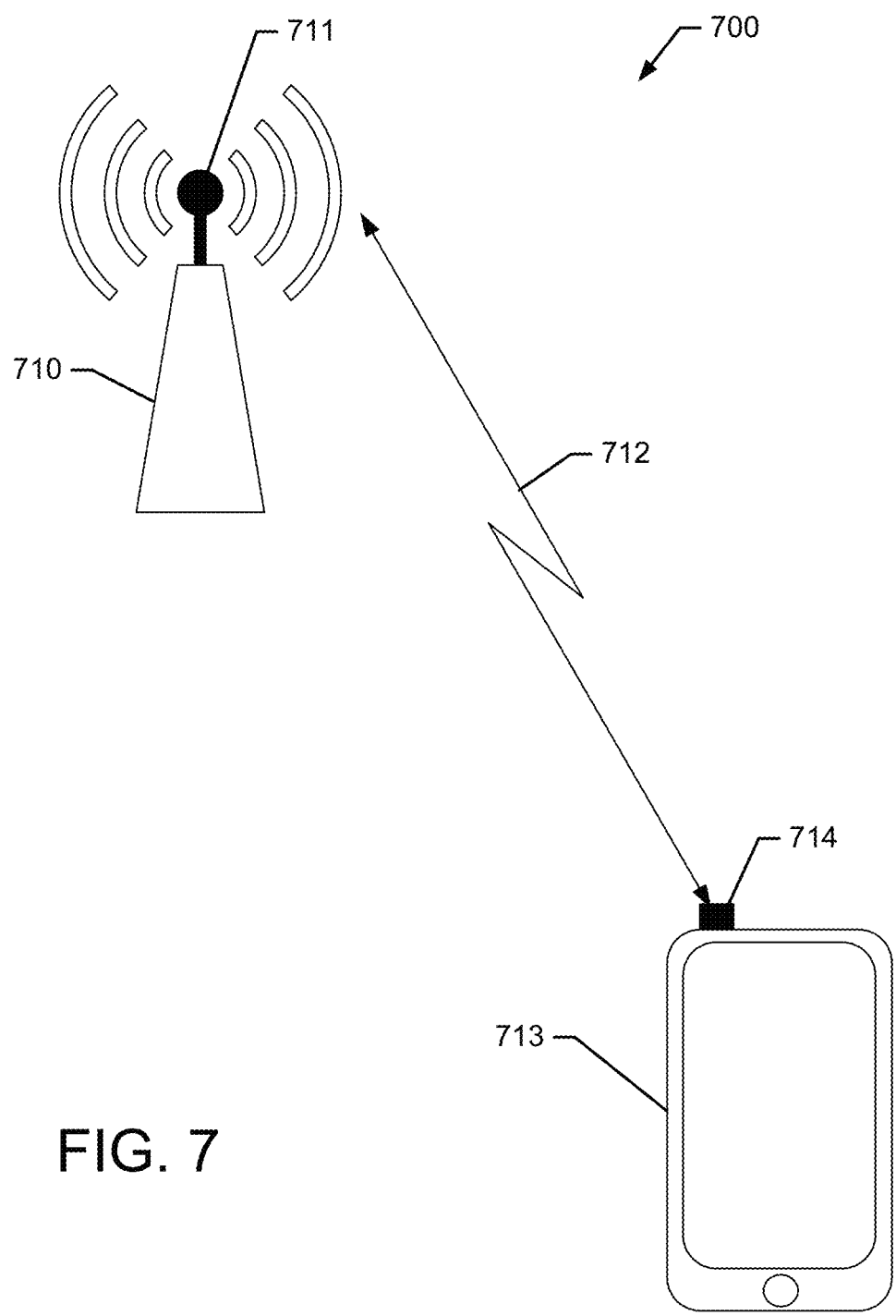
FIG. 7 illustrate an example wireless communications system according to some example embodiments.

Referring now to FIG. 7, an example system in which antenna assemblies, such as those described above, may be employed is shown. The system 700 may be a wireless communications system (e.g., a cellular system) that includes one or more base stations 710 and one or more mobile terminals 713. The base station 710 may establish a communications connection 712 with the mobile terminal 714 (e.g., smart phone). The base station 710 may include an antenna assembly 711, which may be embodied as any of the antenna assemblies described herein to support wireless communications. The mobile terminal 713 may include an antenna assembly 714, which may be embodied as any of the antenna assemblies described herein to support wireless communications.

Having described various example embodiments of the heatsink structures as part of an antenna assembly with a heatsink device, further example embodiments that build on those described above will now be described. In this regard, for example, an antenna assembly is provided that may comprise an antenna and a heatsink structure, according to various example embodiments. The antenna may be configured to support radio communications and generate heat in the process. The antenna may comprise a forward antenna surface configured to transmit or receive communications signals and a rear antenna surface that is affixed to a substrate. The heatsink structure may be positioned to be within a forward electromagnetic field that is emitted from the forward antenna surface and away from the rear antenna surface. The heatsink structure may be configured to perform a convection operation between the antenna and a fluid (e.g., air) to perform thermal dissipation of the heat from the antenna. According to some example embodiments, the antenna assembly may be a component of a base station or a mobile terminal.

According to some example embodiments, the substrate of the antenna assembly may comprise a dielectric material, and a ground plane of the antenna assembly may be affixed to the substrate on a side of the substrate opposite the antenna (a rear side). Additionally or alternatively, the heatsink structure may be disposed over or above the forward antenna surface and may comprise a planar surface that is perpendicular to the forward antenna surface. Additionally or alternatively, the heatsink structure may be physically and electrically connected directly to the forward antenna surface. Additionally or alternatively, the heatsink structure may be physically connected directly to the substrate adjacent to the forward antenna surface via two or more posts, and a standoff gap may be formed between a rearward edge of the heatsink structure and the forward antenna surface. Additionally or alternatively, the heatsink structure may be physically and electrically connected directly to the forward antenna surface via a post, and a standoff gap may be formed between a rearward edge of the heatsink structure and the forward antenna surface. Additionally or alternatively, the post may comprise a controllable switch device configured to receive a signal to selectively open or close an electrical connection between the forward antenna surface and the heatsink structure. Additionally or alternatively, the signal may be a temperature generated thermal signal or an electrostatic force signal for controlling the operation of the switch (e.g., the temperature exceeds a thermal threshold the switch closes). Additionally or alternatively, the controllable switch device may be a micro-electromechanical system (MEMS) cantilever switch.

Additionally or alternatively, the heatsink structure may be a first heatsink structure and the planar surface may be a first planar surface. The antenna assembly may comprise a plurality of heatsink structures including the first heatsink structure and a second heatsink structure. The second heatsink structure may also be positioned to be within a forward electromagnetic field that is emitted from the forward antenna surface and away from the rear antenna surface. The second heatsink structure may be configured to perform a convection operation between the antenna and the fluid to perform thermal dissipation of the heat from the antenna. The second heatsink structure may comprise a second planar surface that is perpendicular to the forward antenna surface and parallel to the first planar surface of the first heatsink structure. Additionally or alternatively, the first heatsink structure may be physically connected directly to the substrate adjacent to the forward antenna surface via two or more posts. A first standoff gap may be formed between a rearward edge of the first heatsink structure and the forward antenna surface, and the second heatsink structure may be physically and electrically connected directly to the forward antenna surface. Additionally or alternatively, the second heatsink structure may be physically and electrically connected directly to the forward antenna surface via a post. A second standoff gap may be formed between a rearward edge of the second heatsink structure and the forward antenna surface. The post may comprise a controllable switch device configured to receive a signal to selectively open or close an electrical connection between the forward antenna surface and the second heatsink structure. The signal may be a temperature generated thermal signal or an electrostatic force signal. The controllable switch device may be a micro-electromechanical system (MEMS) cantilever switch. Additionally or alternatively, the antenna assembly may further comprise a connecting bridge member between the first heatsink structure and the second heatsink structure. The connecting bridge member may be configured to connect between the first heatsink structure and the second heatsink structure without directly contacting the forward antenna surface or the substrate. Additionally or alternatively, the antenna may be configured to operate at a millimeter wavelength. Additionally or alternatively, the antenna may be configured to operates at a microwave frequency.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements or functions, it should be appreciated that different combinations of elements or functions may be provided by alternative embodiments without departing from the scope of the appended claims. In this regard, for example, different combinations of elements or functions than those explicitly described above are also contemplated as may be set forth in some of the appended claims. In cases where advantages, benefits or solutions to problems are described herein, it should be appreciated that such advantages, benefits or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

That which is claimed:

1. An antenna assembly comprising:
   an antenna configured to support radio communications and generate heat, the antenna comprising a forward antenna surface configured to transmit or receive communications signals and a rear antenna surface that is affixed to a substrate; and
   a heatsink structure positioned to be within a forward electromagnetic field that is emitted from the forward antenna surface and away from the rear antenna surface, the heatsink structure being configured to perform a convection operation between the antenna and a fluid to perform thermal dissipation of the heat from the antenna;
   wherein the heatsink structure is disposed over the forward antenna surface and comprises a planar surface that is perpendicular to the forward antenna surface;
   wherein the heatsink structure is physically connected directly to the substrate adjacent to the forward antenna surface via two or more posts;
   wherein a standoff gap is formed between a rearward edge of the heatsink structure and the forward antenna surface.

2. The antenna assembly of claim 1, wherein the substrate comprises a dielectric material;
   wherein a ground plane is affixed to the substrate on a side of the substrate opposite the antenna.

3. The antenna assembly of claim 1, wherein the heatsink structure is a first heatsink structure and the planar surface is a first planar surface;
   wherein the antenna assembly comprises a plurality of heatsink structures including the first heatsink structure and a second heatsink structure;
   wherein the second heatsink structure is also positioned to be within forward electromagnetic field that is emitted from the forward antenna surface and away from the rear antenna surface and is configured to perform convection operation between the antenna and the fluid to perform thermal dissipation of the heat from the antenna;
   wherein the second heatsink structure comprises a second planar surface that is perpendicular to the forward antenna surface and parallel to the first planar surface of the first heatsink structure.

4. The antenna assembly of claim 3,
   wherein the second heatsink structure is physically and electrically connected directly to the forward antenna surface.

5. The antenna assembly of claim 4, wherein the second heatsink structure is physically and electrically connected directly to the forward antenna surface via a post of the two or more posts;
   wherein a second standoff gap is formed between a rearward edge of the second heatsink structure and the forward antenna surface.

6. The antenna assembly of claim 5, wherein the post comprises a controllable switch device configured to receive a signal to selectively open or close an electrical connection between the forward antenna surface and the second heatsink structure.

7. The antenna assembly of claim 6, wherein the signal is a temperature generated thermal signal or an electrostatic force signal.

8. The antenna assembly of claim 6, wherein the controllable switch device is a micro-electromechanical system (MEMS) cantilever switch.

9. The antenna assembly of claim 3 further comprising a connecting bridge member between the first heatsink structure and the second heatsink structure;
   wherein the connecting bridge member connects between the first heatsink structure and the second heatsink structure without directly contacting the forward antenna surface or the substrate.

10. The antenna assembly of claim 1 wherein the antenna is configured to operate at a millimeter wavelength of a microwave frequency.

11. The antenna assembly of claim 1 wherein the antenna is configured to operate at a microwave frequency.

12. An antenna assembly comprising:
   an antenna configured to support radio communications and generate heat, the antenna comprising a forward antenna surface configured to transmit or receive communications signals and a rear antenna surface that is affixed to a substrate; and
   a heatsink structure positioned to be within a forward electromagnetic field that is emitted from the forward antenna surface and away from the rear antenna surface, the heatsink structure being configured to perform a convection operation between the antenna and a fluid to perform thermal dissipation of the heat from the antenna;
   wherein the heatsink structure is disposed over the forward antenna surface and comprises a planar surface that is perpendicular to the forward antenna surface;
   wherein the heatsink structure is physically and electrically connected directly to the forward antenna surface via one or more posts;
   wherein a standoff gap is formed between a rearward edge of the heatsink structure and the forward antenna surface.

13. The antenna assembly of claim 12, wherein the one or more posts comprise a controllable switch device configured to receive a signal to selectively open or close an electrical connection between the forward antenna surface and the heatsink structure.

14. The antenna assembly of claim 13, wherein the signal is a temperature generated thermal signal or an electrostatic force signal.

15. The antenna assembly of claim 13, wherein the controllable switch device is a micro-electromechanical system (MEMS) cantilever switch.

16. A mobile terminal comprising an antenna assembly, the antenna assembly comprising:
   an antenna configured to support radio communications and generate heat, the antenna comprising a forward antenna surface configured to transmit or receive communications signals and a rear antenna surface that is affixed to a substrate; and
   a heatsink structure positioned to be within a forward electromagnetic field that is emitted from the forward antenna surface and away from the rear antenna surface, the heatsink structure being configured to perform a convection operation between the antenna and a fluid to perform thermal dissipation of the heat from the antenna;
   wherein the heatsink structure is disposed over the forward antenna surface and comprises a planar surface that is perpendicular to the forward antenna surface;
   wherein the heatsink structure is physically connected directly to the substrate adjacent to the forward antenna surface via two or more posts;
   wherein a standoff gap is formed between a rearward edge of the heatsink structure and the forward antenna surface.

17. A base station comprising an antenna assembly, the antenna assembly comprising:
   an antenna configured to support radio communications and generate heat, the antenna comprising a forward antenna surface configured to transmit or receive communications signals and a rear antenna surface that is affixed to a substrate; and
   a heatsink structure positioned to be within a forward electromagnetic field that is emitted from the forward antenna surface and away from the rear antenna surface, the heatsink structure being configured to perform a convection operation between the antenna and a fluid to perform thermal dissipation of the heat from the antenna;
   wherein the heatsink structure is disposed over the forward antenna surface and comprises a planar surface that is perpendicular to the forward antenna surface;
   wherein the heatsink structure is physically connected directly to the substrate adjacent to the forward antenna surface via two or more posts;
   wherein a standoff gap is formed between a rearward edge of the heatsink structure and the forward antenna surface.

* * * * *